United States Patent
Liao et al.

(10) Patent No.: US 9,064,893 B2
(45) Date of Patent: Jun. 23, 2015

(54) GRADIENT DOPANT OF STRAINED SUBSTRATE MANUFACTURING METHOD OF SEMICONDUCTOR DEVICE

(71) Applicant: UNITED MICROELECTRONICS CORP., Hsinchu (TW)

(72) Inventors: Chin-I Liao, Tainan (TW); Chin-Cheng Chien, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 13/892,424

(22) Filed: May 13, 2013

(65) Prior Publication Data

US 2014/0335674 A1 Nov. 13, 2014

(51) Int. Cl.
*H01L 21/336* (2006.01)
*H01L 29/66* (2006.01)
*H01L 21/02* (2006.01)

(52) U.S. Cl.
CPC ..... *H01L 29/66636* (2013.01); *H01L 21/02532* (2013.01); *H01L 21/0251* (2013.01); *H01L 21/02579* (2013.01); *H01L 21/0262* (2013.01); *H01L 21/02636* (2013.01)

(58) Field of Classification Search
None
See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |

(Continued)

*Primary Examiner* — Evan Pert
*Assistant Examiner* — Herve Assouman
(74) *Attorney, Agent, or Firm* — WPAT, PC; Justin King

(57) ABSTRACT

A manufacturing method of a semiconductor device is provided. The method includes at least the following steps. A gate structure is formed on a substrate. An epitaxial structure is formed on the substrate, wherein the epitaxial structure comprises SiGe, and the Ge concentration in the epitaxial structure is equal to or higher than 45%. A first cap layer is formed on the epitaxial structure, wherein the first cap layer comprises Si. The first cap layer is doped with boron for forming a flat top surface of the first cap layer.

18 Claims, 7 Drawing Sheets

(56) References Cited

U.S. PATENT DOCUMENTS

| | | |
|---|---|---|
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,667,227 B2 | 2/2010 | Shimamune |
| 7,691,752 B2 | 4/2010 | Ranade |
| 7,781,799 B2 * | 8/2010 | Yu et al. .......................... 257/190 |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0128765 A1 * | 6/2008 | Chen et al. .................... 257/288 |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0093147 A1 | 4/2010 | Liao |
| 2011/0042744 A1 * | 2/2011 | Cheng et al. .................. 257/347 |
| 2011/0183486 A1 * | 7/2011 | Chan et al. .................... 438/300 |
| 2012/0001228 A1 * | 1/2012 | Chong et al. .................. 257/190 |
| 2012/0181625 A1 * | 7/2012 | Kwok et al. .................... 257/408 |

* cited by examiner

GRADIENT DOPANT OF STRAINED SUBSTRATE MANUFACTURING METHOD OF SEMICONDUCTOR DEVICE

BACKGROUND

1. Technical Field

The disclosure relates in general to a manufacturing method of a semiconductor device, and more particularly to a manufacturing method of a semiconductor device having an epitaxial structure with a cap layer formed thereon doped with boron.

2. Description of the Related Art

Epitaxial SiGe layers are usually served as a source/drain for semiconductor devices. Since the lattice constant of the epitaxial SiGe layer is larger than that of a silicon substrate, a strain stress generated to the channel region of the semiconductor device, such as a metal-oxide semiconductor (MOS) transistor device, may efficiently improve the device performance.

It is well-known that the strain stress is increased as the Ge concentration in the epitaxial SiGe layer is increased. However, while the increase of the Ge concentration in the epitaxial SiGe layer improves the device performance, it may cause some problems as well. For example, the distinct difference between the Ge concentrations in the SiGe layer and in the adjacent cap layer may cause a strain relaxation to the epitaxial SiGe layer and/or result in a wavy top surface of the structure, rendering undesirable impacts to the subsequent manufacturing processes.

SUMMARY OF THE INVENTION

The disclosure is directed to a manufacturing method of a semiconductor device. As a cap layer is doped with boron and formed on an epitaxial structure with a high Ge concentration, the strain relaxation of the epitaxial structure can be largely reduced and compensated, and a flat top surface of the cap layer can thus be formed, providing with a superior device performance as well as being advantageous to the subsequent manufacturing processes of the semiconductor device.

According to an embodiment of the present disclosure, a manufacturing method of a semiconductor device is disclosed. The manufacturing method includes at least the following steps. A gate structure is formed on a substrate. An epitaxial structure is formed on the substrate, wherein the epitaxial structure comprises SiGe, and the Ge concentration in the epitaxial structure is equal to or higher than 45%. A first cap layer is formed on the epitaxial structure, wherein the first cap layer comprises Si. The first cap layer is doped with boron for forming a flat top surface of the first cap layer.

According to another embodiment of the present disclosure, a manufacturing method of a semiconductor device is disclosed. The manufacturing method includes at least the following steps. A gate structure is formed on a substrate. An epitaxial structure is formed on the substrate, wherein the epitaxial structure is doped with boron and comprises SiGe, the Ge concentration in the epitaxial structure is equal to or higher than 45%, and the boron concentration in the epitaxial structure is higher than $1E20\ cm^{-3}$. A first cap layer is formed on the epitaxial structure, wherein the first cap layer comprises Si and is doped with boron, and the boron concentration in the first cap layer is higher than $5E20\ cm^{-3}$. An under layer is formed below the epitaxial structure, wherein the under layer comprises SiGe and has a gradient Ge concentration upwardly increased from 40% to 55%.

The disclosure will become apparent from the following detailed description of the preferred but non-limiting embodiments. The following description is made with reference to the accompanying drawings.

DETAILED DESCRIPTION OF THE INVENTION

Figure 1A:
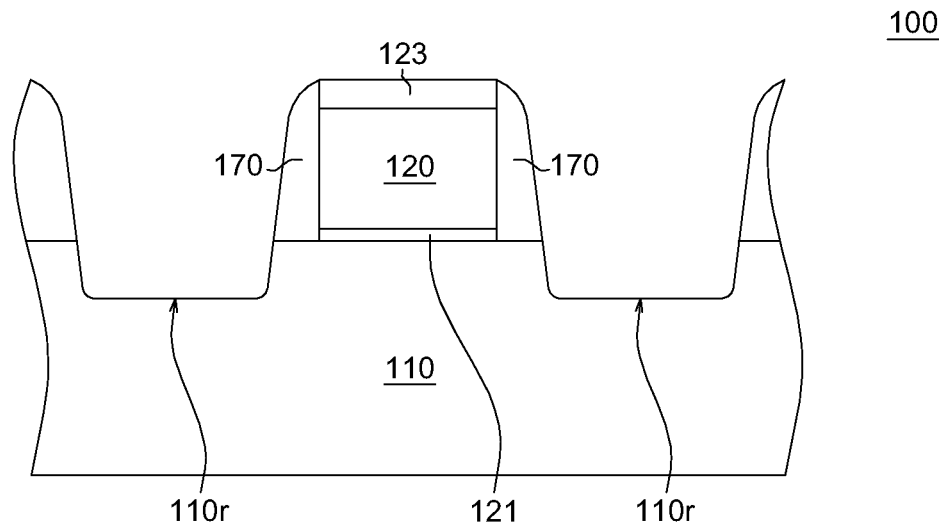
FIGS. 1A-1C illustrate a manufacturing method of a semiconductor device according to a first preferred embodiment of the disclosure.

In the embodiments of the disclosure, a cap layer is doped with boron and formed on an epitaxial structure with a high Ge concentration, such that the strain relaxation of the epitaxial structure can be largely reduced and compensated, and a flat top surface of the cap layer can thus be formed, providing with a superior device performance as well as being advantageous to the subsequent manufacturing processes of the semiconductor device. The embodiments are described in details with reference to the accompanying drawings. The procedures and details of the formation method and the structure of the embodiments are for exemplification only, not for limiting the scope of protection of the disclosure. Moreover, the identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Figure 1B:
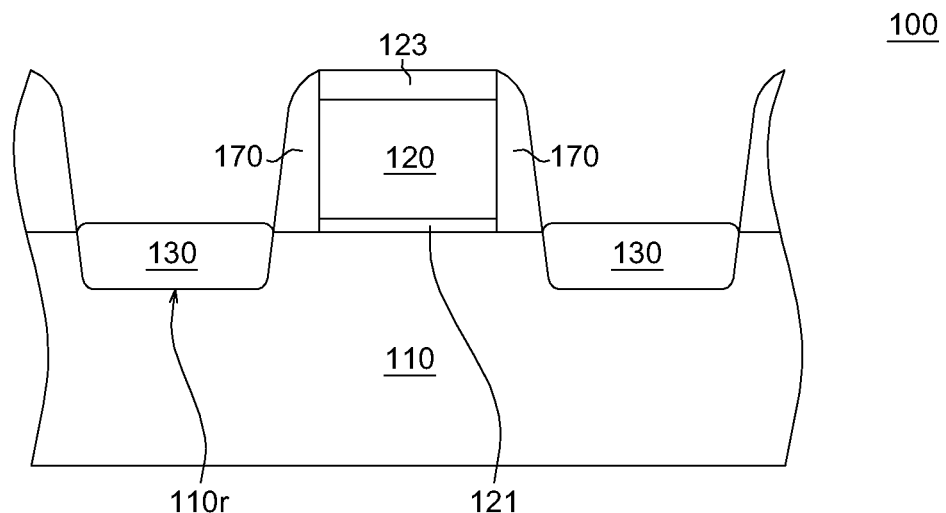
Figure 1C:
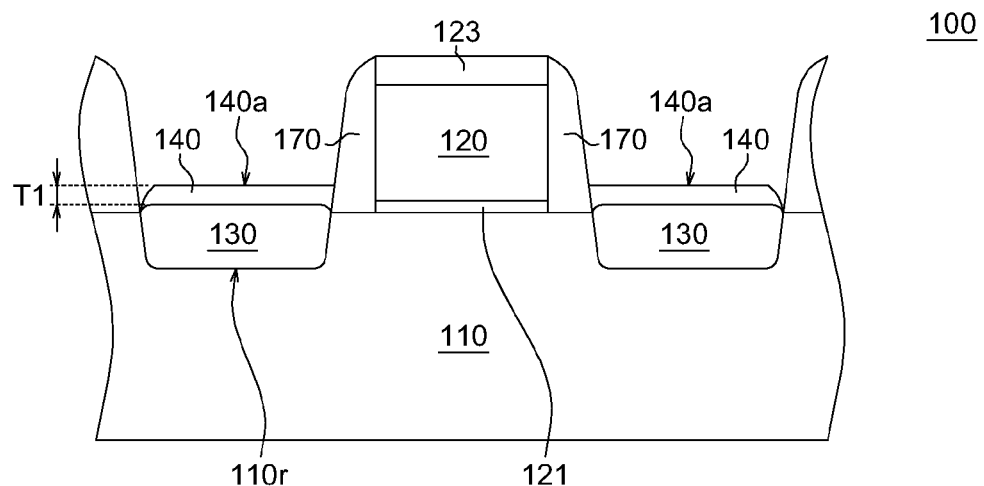

Referring to FIGS. 1A-1C, FIGS. 1A-1C illustrate a manufacturing method of a semiconductor device 100 according to a first preferred embodiment of the disclosure. As shown in FIG. 1A, a gate structure 120 is formed on a substrate 110. In the embodiment, the gate structure 120 is formed as defined by a patterned hard mask 123, and a gate insulating layer 121 is formed on the substrate 110 prior to the formation of the gate structure 120. The substrate 110 may be a Si substrate, the gate structure 120 may include metal or polysilicon, and the gate insulating layer 121 may include a dielectric material, such as silicon oxide. In the embodiment, the substrate 110 may have at least a recess 110r located on a side of the gate structure 120. As shown in FIG. 1A, in the present embodiment, the recesses 110r are located on two sides of the gate structure 120, and a spacer 170 is formed on a sidewall of the gate structure 120.

Next, as shown in FIG. 1B, an epitaxial structure 130 is formed on the substrate 110. The epitaxial structure 130 comprises SiGe. The Ge concentration in the epitaxial structure 130 is equal to or higher than 45%, and preferably up to 55-60%. In the embodiment, the epitaxial structure 130 is formed in the recess 110r.

While the driving voltage of the device is kept constant, the higher the Ge concentration in the epitaxial structure is, the higher the driving current of the device will be, and thus the power is higher, such that the overall performance of the device is improved. However, it is commonly known that a significant increase of Ge concentration in the epitaxial structure (SiGe) may easily cause an undesired strain relaxation, resulting in a dramatic drop in the device performance. Compared to the Ge concentrations of mostly less than 40% in the conventional epitaxial structures, according to the embodiments of the disclosure, the Ge concentration of equal to or higher than 45% in the epitaxial structure 130 can greatly improve the device performance by 20-50%.

In the embodiment, the epitaxial structure 130 may further be doped with boron, and the boron concentration in the epitaxial structure 130 is higher than 1E20 $cm^{-3}$. The doping process may be performed together with or after the formation of the epitaxial structure 130. Boron in the epitaxial structure 130 produces electron holes, and thus more conductive carriers are produced in the device due to the presence of boron, such that the resistance of the device is decreased, and the driving current is increased. As the high Ge concentration may block a portion of the boron doped in the epitaxial structure 130 from being diffused as electron holes, the high boron concentration of higher than 1E20 $cm^{-3}$ can compensate the possible increase of the resistance caused by the trapped boron in the epitaxial structure 130, providing sufficient boron for supplying conductive carriers. That is, such combination of Ge concentration of equal to or higher than 45% with boron concentration of higher than 1E20 $cm^{-3}$ is provided with both improved device performance due to less strain relaxation as well as low resistance due to sufficient conductive carriers supplied.

In the embodiment, the epitaxial structure 130 is formed by, such as, a CVD process or a SEG (selective epitaxial growth) process. The gas sources for boron, Si, and Ge are exemplarily but not limited to $B_2H_6$, $SiH_4$, and $GeH_4$, respectively.

Next, as shown in FIG. 1C, a first cap layer 140 is formed on the epitaxial structure 130, and the first cap layer 140 is doped with boron. The first cap layer 140 comprises Si and is doped with boron for forming a flat top surface 140a. The boron concentration in the first cap layer 140 is higher than 5E20 $cm^{-3}$, and the Ge concentration in the first cap layer 140 is substantially 0. The first cap layer 140 formed on the epitaxial structure 130 prevents the agglomeration formed by metals and Ge in the subsequent silicide process from happening, which may increase the resistance and influence the electrical properties of the device. Furthermore, the first cap layer 140 with a thickness T1 of equal to or larger than 50 Å can serve as a stopping layer in the subsequent chemical etching process and protect the epitaxial structure 130 from being damaged.

In addition, while the high Ge concentration of equal to or higher than 45% in the epitaxial structure 130 provides a superior device performance, the strain relaxation of the epitaxial structure 130 may easily occur due to the such high Ge concentration, and the surface of a silicon cap layer, conventionally formed on top of the epitaxial structure 130 for reducing the strain relaxation, may be wavy, rendering undesirable impacts to the subsequent manufacturing processes. In the embodiment, the first cap layer 140 with boron concentration of higher than 5E20 $cm^{-3}$ can largely compensate and reduce the strain relaxation of the epitaxial structure 130 from about 33% to about 5%, and preferably to about 1.7%, and the flat top surface 140a of the first cap layer 140 is thus formed.

Likewise with the doping process for the epitaxial structure 130, the doping process for the first cap layer 140 may be performed together with or after the formation of the first cap layer 140. In the embodiment, the first cap layer 140 is formed by, such as, a CVD process or a SEG (selective epitaxial growth) process. The gas sources for boron, Si, and Ge are exemplarily but not limited to $B_2H_6$, $SiH_4$, and $GeH_4$, respectively.

In the present embodiment, the first cap layer 140 is preferably grown from $SiH_4$. Although some Si precursors other than $SiH_4$, such as dichloromethane (DCS), may be used for growing the first cap layer 140, and a somewhat flat top surface of the first cap layer 140 may be obtained; however, applying Si precursors other than $SiH_4$ may suffer from a selective loss of the epitaxial growth of the first cap layer 140, which may cause the device to fail. In summary, the first cap layer 140 formed of $SiH_4$ can be provided with a flat top surface 140a as well as the prevention from the undesired selective loss.

In an embodiment, the semiconductor device 100 is such as a MOS device. Once an ion implantation is performed to the epitaxial structure 130, regions with the p-type or n-type dopants of the epitaxial structure 130 located on two sides of the gate structure 120 may serve as source/drain regions of the semiconductor device 100.

Figure 2A:
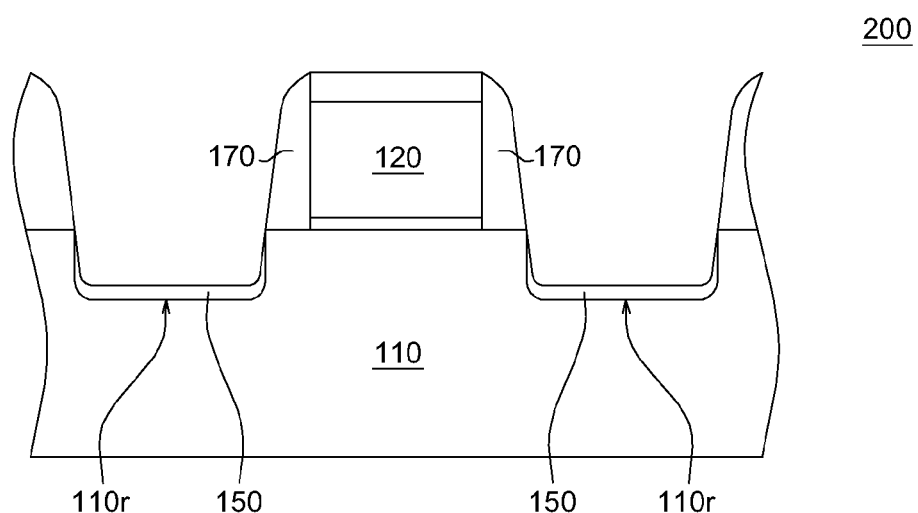
FIGS. 2A-2B illustrate a manufacturing method of a semiconductor device according to a second preferred embodiment of the disclosure.
Figure 2B:
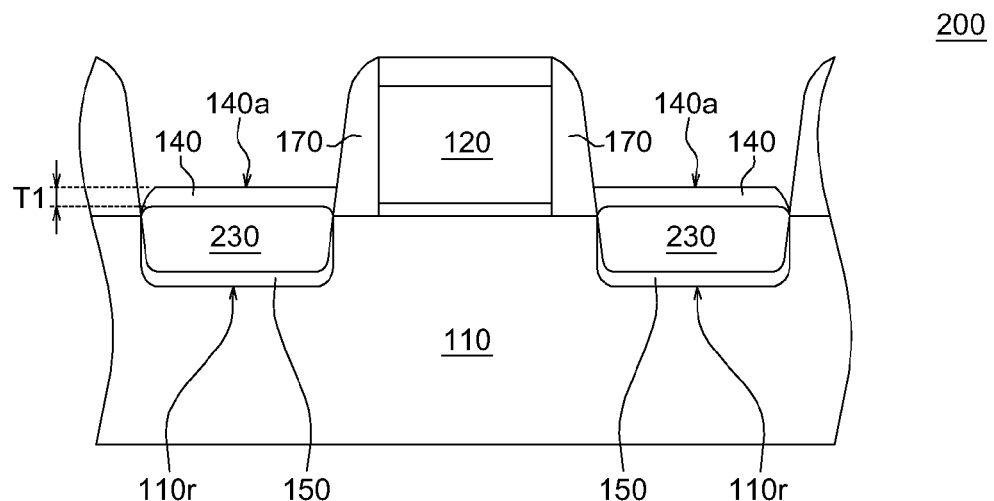

Referring to FIGS. 1A and 2A-2B, FIGS. 2A-2B illustrate a manufacturing method of a semiconductor device 200 according to a second preferred embodiment of the disclosure. The elements in the first and second embodiments sharing the same labeling are the same elements, and the description of which are as aforementioned.

As shown in FIG. 1A, the gate structure 120 is formed on the substrate 110. In the embodiment, the gate structure 120 is formed as defined by the patterned hard mask 123, and the gate insulating layer 121 is formed on the substrate 110 prior to the formation of the gate structure 120. The gate structure 120 may include metal or polysilicon, and the gate insulating layer 121 may include a dielectric material, such as silicon oxide. In the embodiment, the substrate 110 may have at least the recess 110r located on a side of the gate structure 120. As shown in FIG. 1A, in the present embodiment, the recesses 110r are located on two sides of the gate structure 120, and the spacer 170 is formed on a sidewall of the gate structure 120.

Next, as shown in FIG. 2A, an under layer 150 is formed on the substrate 110. The under layer 150 comprises SiGe and has a gradient Ge concentration upwardly increased from 40% to 55%. That is, the Ge concentration of the under layer 150 in the region close to the substrate 110 (e.g. the bottom surface of the recess 110r) is about 40%, and the Ge concentration of the under layer 150 in the region closed to the epitaxial structure 230 is about 55%. In the present embodiment, as shown in FIG. 2A, the under layer 150 is formed on the bottom surface of the recess 110r, followed by the formation of an epitaxial structure on the under layer 150 in the recess 110r, and the under layer 150 may be formed by, such as, a CVD process or a SEG (selective epitaxial growth) process.

Next, as shown in FIG. 2B, an epitaxial structure 230 is formed on the substrate 110, wherein the epitaxial structure 230 is doped with boron and comprises SiGe, the Ge concentration in the epitaxial structure is equal to or higher than 45%, preferably up to 55-60%, and the boron concentration in the epitaxial structure is higher than 1E20 $cm^{-3}$. In the present embodiment, the epitaxial structure 230 is formed in the recess 110r, and the under layer 150 is formed below the epitaxial structure 230. And then, as shown in FIG. 2B, the first cap layer 140 is formed on the epitaxial structure 230, wherein the first cap layer 140 comprises Si and is doped with boron, the boron concentration in the first cap layer 140 is higher than 5E20 cm$^{-3}$, and the thickness T1 of the first cap layer 140 is equal to or larger than 50 Å.

Since the Ge concentration in the epitaxial structure 230 may be up to 55-60%, and the Ge concentration in the substrate 110, being a Si substrate, is a lot lower than that in the epitaxial structure 230, the gradient Ge concentration in the under layer 150 provides a compensation to the strain relaxation between the epitaxial structure 230 and the substrate 110.

In the embodiment, the gas sources for boron, Si, and Ge are exemplarily but not limited to $B_2H_6$, $SiH_4$, and $GeH_4$, respectively.

In an embodiment, the semiconductor device 200 is such as a MOS device. An ion implantation may be performed to the epitaxial structure 230 for forming source/drain regions of the epitaxial structure 230 located on two sides of the gate structure 120.

Referring to FIGS. 1A and 3A-3C, FIGS. 3A-3C illustrate a manufacturing method of a semiconductor device 300 according to a third preferred embodiment of the disclosure. The elements in the first, second, and third embodiments sharing the same labeling are the same elements, and the description of which are as aforementioned.

As shown in FIG. 1A, the gate structure 120, the gate insulating layer 121, and the patterned hard mask 123 are formed on the substrate 110. In the embodiment, the substrate 110 may have at least the recess 110r located on a side of the gate structure 120. As shown in FIG. 1A, in the present embodiment, the recesses 110r are located on two sides of the gate structure 120, and the spacer 170 is formed on a sidewall of the gate structure 120.

Figure 3A:
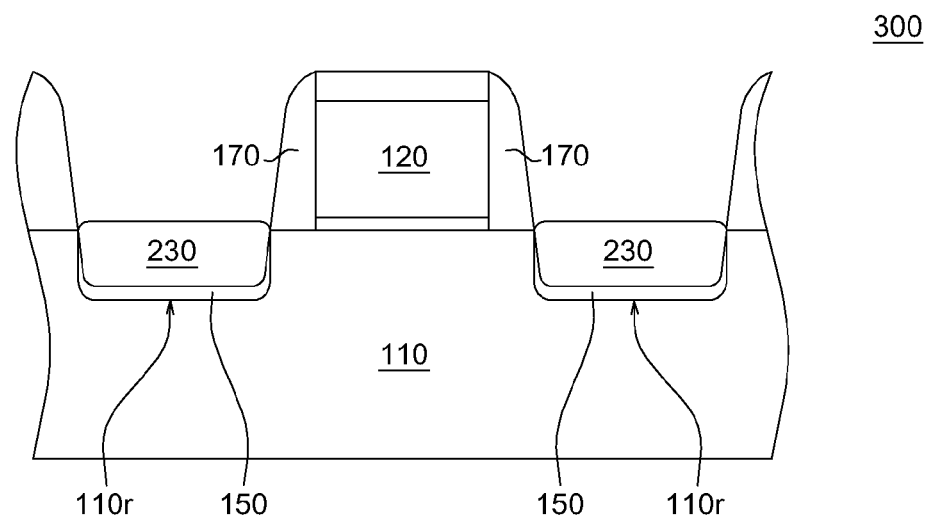
FIGS. 3A-3C illustrate a manufacturing method of a semiconductor device according to a third preferred embodiment of the disclosure.

Next, as shown in FIG. 3A, the under layer 150 is optionally formed on the substrate 110, and the epitaxial structure 230 is formed on the under layer 150. In the present embodiment, the under layer 150 is formed on the bottom surface of the recess 110r, followed by the formation of the epitaxial structure 230 on the under layer 150 in the recess 110r. The epitaxial structure 230 is doped with boron and comprises SiGe, and the concentrations of Ge and Boron are as described above for the epitaxial structure 230. In the embodiment, the epitaxial structure 230 may be replaced by the epitaxial structure 130, and the properties of which have been previously described in the first embodiment.

Figure 3B:
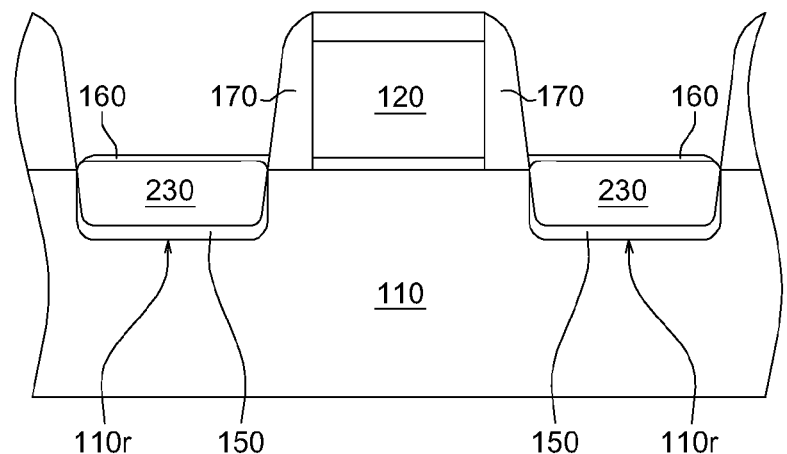

Next, as shown in FIG. 3B, a second cap layer 160 is formed on the epitaxial structure 230. The second cap layer 160 comprises SiGe and has a gradient Ge concentration upwardly decreased; that is, the Ge concentration of the second cap layer 160 in the region close to the epitaxial structure 230 is higher than that in the region closed to the first cap layer 140. Since the Ge concentration in the epitaxial structure 230 may be up to 55-60%, and the Ge concentration in the first cap layer 140 is a lot lower than that in the epitaxial structure 230, the gradient Ge concentration in the second cap layer 160 provides a compensation to the strain relaxation between the epitaxial structure 230 and the first cap layer 140.

Figure 3C:
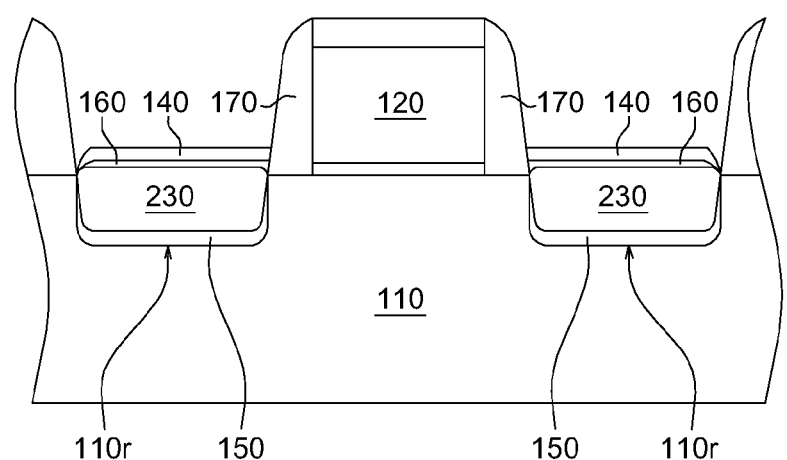

And then, as shown in FIG. 3C, the first cap layer 140 is formed on the epitaxial structure 230. In the embodiment, the second cap layer 160 is formed between the first cap layer 140 and the epitaxial structure 230.

In an embodiment, the semiconductor device 300 is such as a MOS device. An ion implantation may be performed to the epitaxial structure 230 for forming source/drain regions of the epitaxial structure 230 located on two sides of the gate structure 120.

Referring to FIGS. 2A and 4A-4C, FIGS. 4A-4C illustrate a manufacturing method of a semiconductor device 400 according to a fourth preferred embodiment of the disclosure. The elements in the first, second, third, and fourth embodiments sharing the same labeling are the same elements, and the description of which are as aforementioned.

As shown in FIG. 2A, the gate structure 120, the gate insulating layer 121, and the patterned hard mask 123 are formed on the substrate 110. In the embodiment, the substrate 110 may have at least the recess 110r located on a side of the gate structure 120. As shown in FIG. 2A, in the present embodiment, the recesses 110r are located on two sides of the gate structure 120, and the spacer 170 is formed on a sidewall of the gate structure 120.

Figure 4A:
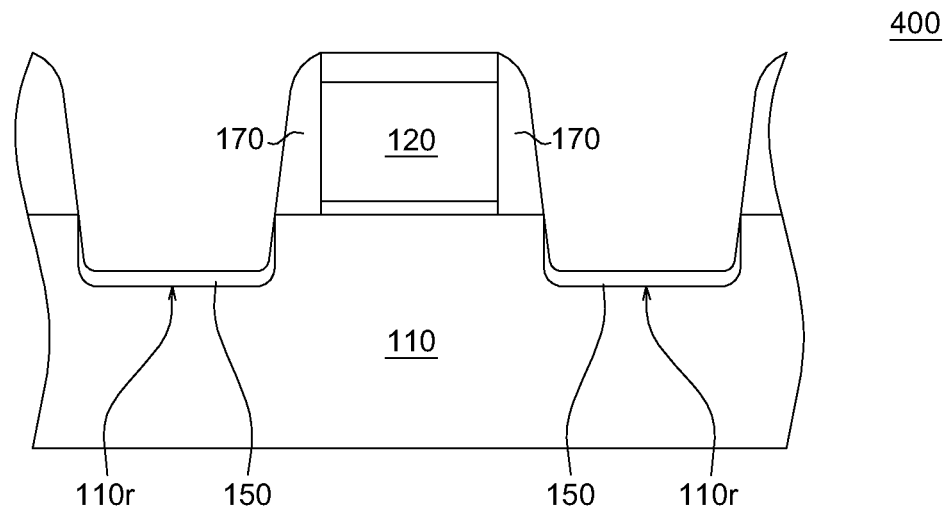
FIGS. 4A-4C illustrate a manufacturing method of a semiconductor device according to a fourth preferred embodiment of the disclosure.

Next, as shown in FIG. 4A, the under layer 150 is optionally formed on the bottom surface of the recess 110r.

Figure 4B:
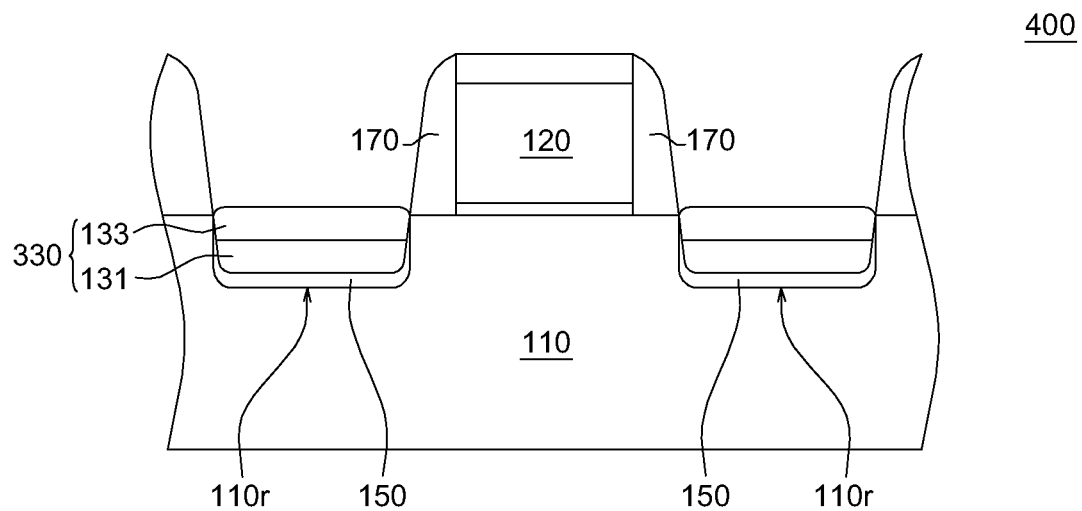

Next, as shown in FIG. 4B, an epitaxial structure 330 is formed on the substrate 110, wherein the epitaxial structure 330 comprises SiGe, and the Ge concentration in the epitaxial structure 330 is equal to or higher than 45%. In the present embodiment, the epitaxial structure 330 is formed on the under layer 150. The formation of the epitaxial structure 330 further comprises, such as, the following steps. A first epitaxial layer 131 is formed on the substrate 110, and a second epitaxial layer 133 is formed on the first epitaxial layer 131, wherein the Ge concentration in the first epitaxial layer 131 is lower than the Ge concentration in the second epitaxial layer 133. For example, the Ge concentration in the first epitaxial layer 131 may be about 55%, and the Ge concentration in the second epitaxial layer 133 may be about 60%. The first epitaxial layer 131 and the second epitaxial layer 133 are formed separately by, such as, a SEG process. In the present embodiment, the epitaxial structure 330 is formed in the recess 110r.

In the embodiment, the epitaxial structure 330 is further doped with boron, and the boron concentration in the epitaxial structure 330, including the first epitaxial layer 131 and the second epitaxial layer 133, is higher than 1E20 cm$^{-3}$.

Figure 4C:
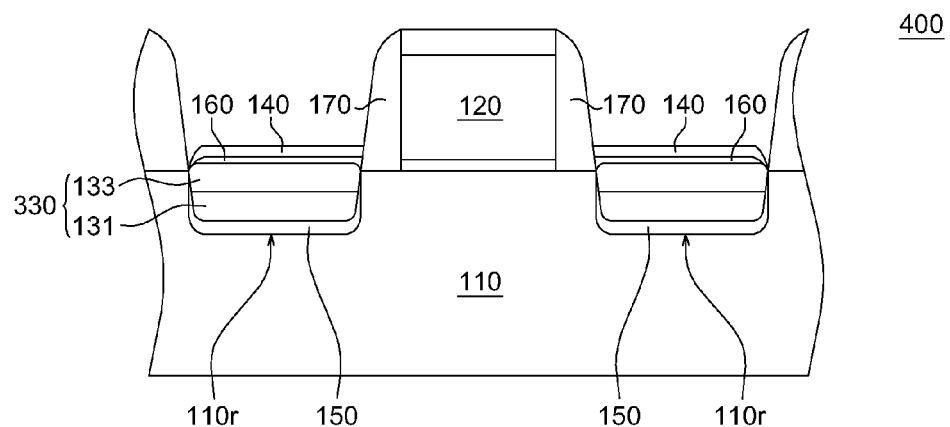

Next, as shown in FIG. 4C, the first cap layer 140 is formed on the epitaxial structure 330, and the first epitaxial layer 131 is formed between the first cap layer 140 and the second epitaxial layer 133. In the present embodiment, the first cap layer 140 is formed on the second cap layer 160, and the second epitaxial layer 133 is formed between the second cap layer 160 and the first epitaxial layer 131

In an embodiment, the semiconductor device 400 is such as a MOS device. An ion implantation may be performed to the epitaxial structure 330 for forming source/drain regions of the epitaxial structure 330 located on two sides of the gate structure 120.

Figure 5A:
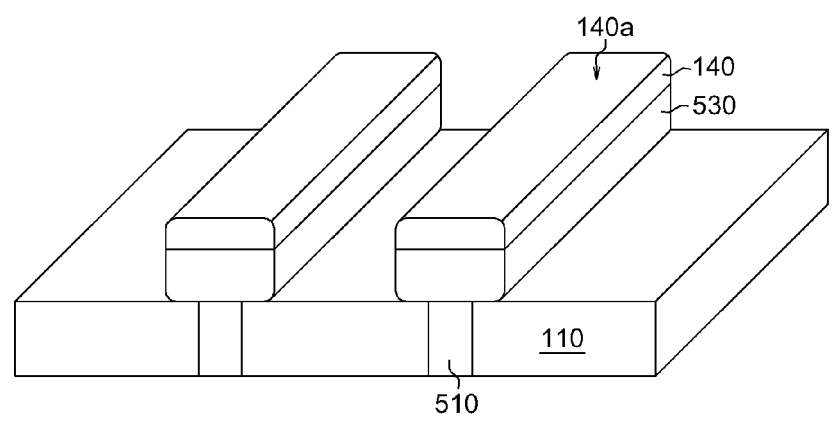
FIGS. 5A-5B illustrate a manufacturing method of a semiconductor device according to a fifth preferred embodiment of the disclosure.
Figure 5B:
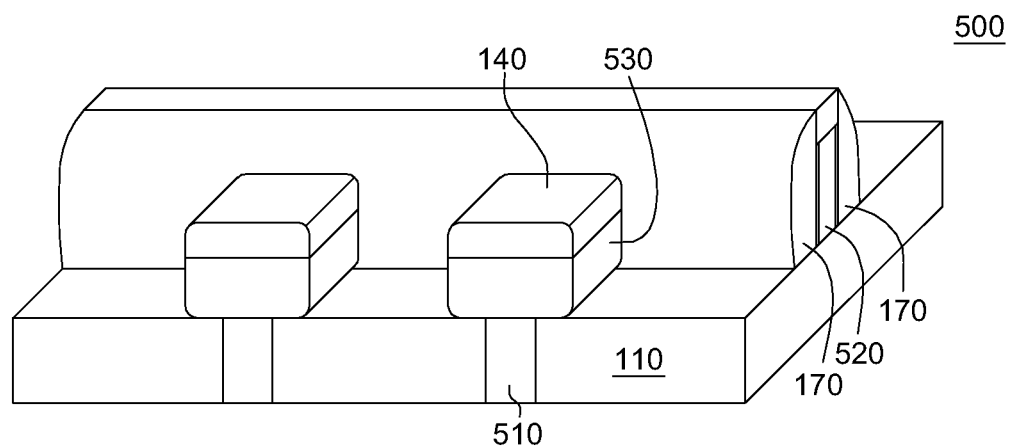

Referring to FIGS. 5A-5B, FIGS. 5A-5B illustrate a manufacturing method of a semiconductor device 500 according to a fifth preferred embodiment of the disclosure. The elements in the first to fifth embodiments sharing the same labeling are the same elements, and the description of which are as aforementioned.

As shown in FIG. 5A, an epitaxial structure 530 is formed on the substrate 110, and the first cap layer 140 is formed on the epitaxial structure 530. The epitaxial structure 530 comprises SiGe, and the Ge concentration in the epitaxial structure 530 is equal to or higher than 45%, preferably up to 55-60%. The first cap layer 140 comprises Si and is doped with boron for forming a flat top surface 140a. In the present embodiment, as shown in FIG. 5A, the epitaxial structure 530 along with the first cap layer 140 have a striped pattern, and the epitaxial structure 530 is formed on the fin structure 510, which is formed within the substrate 110.

In the embodiment, the epitaxial structure 530 may further be doped with boron. The doping process may be performed together with or after the formation of the epitaxial structure 530. The boron concentration in the epitaxial structure 530 is higher than 1E20 cm$^{-3}$. In the embodiment, the under layer 150 (not shown in FIG. 5A), as described in the previous embodiments, may further be formed between the fin structure 510 and the epitaxial structure 530, and the second cap layer 160 (not shown in FIG. 5A) may further be formed between the first cap layer 140 and the epitaxial structure 530. Furthermore, the epitaxial structure 530 may be replaced by the epitaxial structure 330, comprising the first epitaxial layer 131 and the second epitaxial layer 133, and the properties of which have been previously described in the previous embodiment.

Next, as shown in FIG. 5B, a gate structure 520 is formed on the epitaxial structure 530 and on the substrate 110, and the spacer 170 is formed on a sidewall of the gate structure 520. The gate structure 520 is extended in a direction perpendicular to a direction in which the strips of the epitaxial structure 530 are extended. In the embodiment, a dielectric layer (not shown in FIG. 5B) is further formed between the gate structure 520 and the epitaxial structure 530.

In an embodiment, the semiconductor device 500 is such as a fin field-effect transistor (FINFET). After an ion implantation is performed to the epitaxial structure 530, the regions with the p-type or n-type dopants of the epitaxial structure 530 located on two sides of the gate structure 520 may serve as source/drain regions.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor device, comprising:
    forming a gate structure on a substrate;
    forming an epitaxial structure on the substrate, wherein the epitaxial structure comprises SiGe, and the Ge concentration in the epitaxial structure is 45-60%;
    doping the epitaxial structure with boron, and the boron concentration in the epitaxial structure is higher than 1E20 cm$^{-3}$;
    forming a first cap layer on the epitaxial structure, wherein the first cap layer comprises Si;
    forming a second cap layer between the first cap layer and the epitaxial structure, wherein the second cap layer comprises SiGe and has a gradient Ge concentration upwardly decreased; and
    doping the first cap layer with boron for forming a flat top surface of the first cap layer.

2. The manufacturing method of the semiconductor device according to claim 1, wherein the substrate has at least a recess on a side of the gate structure, and the epitaxial structure is formed in the recess.

3. The manufacturing method of the semiconductor device according to claim 2, further comprising:
    forming an under layer on the bottom surface of the recess, wherein the under layer comprises SiGe and has a gradient Ge concentration upwardly increased from 40% to 55%.

4. The manufacturing method of the semiconductor device according to claim 1, wherein the gate structure is formed on the epitaxial structure.

5. The manufacturing method of the semiconductor device according to claim 1, further comprising:
    forming an under layer below the epitaxial structure, wherein the under layer comprises SiGe and has a gradient Ge concentration upwardly increased from 40% to 55%.

6. The manufacturing method of the semiconductor device according to claim 1, wherein the thickness of the first cap layer is equal to or larger than 50 Å.

7. The manufacturing method of the semiconductor device according to claim 1, further comprising:
    forming a spacer on a sidewall of the gate structure.

8. The manufacturing method of the semiconductor device according to claim 1, wherein the step of forming the first cap layer and the step of doping the first cap layer are performed simultaneously.

9. The manufacturing method of the semiconductor device according to claim 1, wherein a gas source for boron is $B_2H_6$, a gas source for Si is $SiH_4$, and a gas source for Ge is $GeH_4$.

10. The manufacturing method of the semiconductor device according to claim 1, wherein the step of forming the epitaxial structure comprising:
    forming a first epitaxial layer on the substrate; and
    forming a second epitaxial layer, wherein the second epitaxial layer is formed between the first cap layer and the first epitaxial layer, and the Ge concentration in the first epitaxial layer is lower than the Ge concentration in the second epitaxial layer.

11. A manufacturing method of a semiconductor device, comprising:
    forming a gate structure on a substrate;
    forming an epitaxial structure on the substrate, wherein the epitaxial structure is doped with boron and comprises SiGe, the Ge concentration in the epitaxial structure is equal to or higher than 45%, and the boron concentration in the epitaxial structure is higher than 1E20 cm-3;
    forming a first cap layer on the epitaxial structure, wherein the first cap layer comprises Si and is doped with boron, and the boron concentration in the first cap layer is higher than 5E20 cm-3; and
    forming an under layer below the epitaxial structure, wherein the under layer comprises SiGe and has a gradient Ge concentration upwardly increased from 40% to 55%.

12. The manufacturing method of the semiconductor device according to claim 11, wherein the substrate has at least a recess on a side of the gate structure, and the epitaxial structure is formed in the recess.

13. The manufacturing method of the semiconductor device according to claim 12, wherein the under layer is formed on the bottom surface of the recess.

14. The manufacturing method of the semiconductor device according to claim 11, further comprising:
    forming a second cap layer between the first cap layer and the epitaxial structure, wherein the second cap layer comprises SiGe and has a gradient Ge concentration upwardly decreased.

15. The manufacturing method of the semiconductor device according to claim 11, wherein a thickness of the first cap layer is equal to or larger than 50 Å.

16. The manufacturing method of the semiconductor device according to claim 11, further comprising:
    forming a spacer on a sidewall of the gate structure.

17. The manufacturing method of the semiconductor device according to claim 11, wherein a gas source for boron is $B_2H_6$, a gas source for Si is $SiH_4$, and a gas source for Ge is $GeH_4$.

18. The manufacturing method of the semiconductor device according to claim 11, wherein the step of forming the epitaxial structure comprising:

forming a first epitaxial layer on the substrate; and forming a second epitaxial layer, wherein the second epitaxial layer is formed between the first cap layer and the first epitaxial layer, and the Ge concentration in the first epitaxial layer is lower than the Ge concentration in the second epitaxial layer.

\* \* \* \* \*